(12) United States Patent
Izumi et al.

(10) Patent No.: US 7,825,026 B2
(45) Date of Patent: Nov. 2, 2010

(54) METHOD FOR PROCESSING COPPER SURFACE, METHOD FOR FORMING COPPER PATTERN WIRING AND SEMICONDUCTOR DEVICE MANUFACTURED USING SUCH METHOD

(75) Inventors: Akira Izumi, Kitakyushu (JP); Masamichi Ishihara, Kitakyushu (JP)

(73) Assignee: Kyushu Institute of Technology, Fukuoka (JP)

( * ) Notice: Subject to any disclaimer, the term of this patent is extended or adjusted under 35 U.S.C. 154(b) by 924 days.

(21) Appl. No.: 11/569,144

(22) PCT Filed: Jun. 3, 2005

(86) PCT No.: PCT/JP2005/010223
§ 371 (c)(1),
(2), (4) Date: Nov. 15, 2006

(87) PCT Pub. No.: WO2005/122230
PCT Pub. Date: Dec. 22, 2005

(65) Prior Publication Data
US 2007/0187812 A1    Aug. 16, 2007

(30) Foreign Application Priority Data
Jun. 7, 2004 (JP) .............................. 2004-167891
Dec. 28, 2004 (JP) .............................. 2004-378965

(51) Int. Cl.
*H01L 21/44* (2006.01)
(52) U.S. Cl. ................ 438/687; 438/626; 438/637; 438/648; 438/692; 438/694; 438/610; 438/632; 257/E21.497; 257/E21.219; 257/E21.226; 257/E21.23; 257/E21.313; 977/773; 977/777

(58) Field of Classification Search ................. 438/687, 438/652, 617, 610, 626, 631, 632, 648, 656, 438/672, 685, 692, 694, 906, FOR. 102; 977/773, 777; 257/E21.219, E21.226, E21.23, 257/E21.313, E21.497
See application file for complete search history.

(56) References Cited

U.S. PATENT DOCUMENTS

| | | | | |
|---|---|---|---|---|
| 6,069,094 A * | 5/2000 | Matsumura et al. | ......... | 438/788 |
| 6,472,459 B2 * | 10/2002 | Morales et al. | ............. | 524/439 |
| 6,660,634 B1 * | 12/2003 | Ngo et al. | ................... | 438/687 |
| 2004/0115933 A1 * | 6/2004 | Jung et al. | ................... | 438/687 |

FOREIGN PATENT DOCUMENTS

| | | |
|---|---|---|
| JP | 10-056060 | 2/1998 |
| JP | 10-308120 | 11/1998 |
| JP | 11-026465 | 1/1999 |
| JP | 2001-064794 | 3/2001 |
| JP | 2001-176878 | 6/2001 |
| JP | 2002-026014 | 1/2002 |
| JP | 2002-075999 | 3/2002 |
| JP | 2002-110679 | 4/2002 |
| JP | 2003-347241 | 12/2003 |
| JP | 2004-127503 | 4/2004 |

* cited by examiner

*Primary Examiner*—Julio J Maldonado
(74) *Attorney, Agent, or Firm*—McGlew and Tuttle, P.C.

(57) ABSTRACT

A gas inlet is disposed in a lower portion of a reaction chamber, a copper substrate is disposed in an upper portion thereof, and a tungsten catalytic body heated to 1600° C. is disposed midway between the two. Ammonia gas introduced from the gas inlet is decomposed by the tungsten catalytic body, a chemical species generated by the decomposition reacts with a surface of the copper substrate, and reduces and removes a contaminant on the copper surface, and a $Cu_3N$ thin film is formed on the copper substrate surface. This $Cu_3N$ film has the action of a film which prevents the oxidation of copper. This $Cu_3N$ film is thermally decomposed and removed when heated to temperatures of not less than 300° C., leaving a clean copper surface behind.

10 Claims, 7 Drawing Sheets

SECTIONAL VIEW OF SEMICONDUCTOR DEVICE

COPPER SURFACE CLEANING
BY ATOMIC HYDROGEN (OXIDES)

COPPER SURFACE CLEANING
BY ATOMIC HYDROGEN (OXIDES)

COPPER SURFACE CLEANING BY ATOMIC HYDROGEN
(CARBON-BASED GASES)

COPPER SURFACE CLEANING BY ATOMIC HYDROGEN
(CARBON-BASED GASES)

METHOD FOR PROCESSING COPPER SURFACE, METHOD FOR FORMING COPPER PATTERN WIRING AND SEMICONDUCTOR DEVICE MANUFACTURED USING SUCH METHOD

TECHNICAL FIELD

The present invention relates to a method of processing a copper surface which involves reducing and removing a contaminant on the copper surface, simultaneously forming a copper surface protective film capable of being easily removed, and removing the protective film from the copper surface on which the protective film is formed, a copper metal nanoparticle formed by this treatment method, a method of forming a patterned copper interconnect in which a decrease in resistance after interconnect formation is aimed at in forming a patterned interconnect by a direct writing technique using copper metal nanoparticles, and a semiconductor device fabricated by using this method.

BACKGROUND ART

A copper surface is apt to be readily oxidized. When during a process a copper surface is allowed to stand in the air for a long time or comes into contact with an oxidizing atmosphere, the copper surface is oxidized and it is necessary to perform an intermediate treatment, such as pickling, during a process thereafter. In order to prevent the oxidation of a copper surface, it has hitherto been a general practice to clean the copper surface at the beginning of a process, and to continuously perform the process thereafter in a clean atmosphere, thereby preventing the oxidation of the copper surface. However, in a case where a process is interrupted in the course of the process and a copper surface has to be exposed to the air for a long time or in a case where a copper surface has to be exposed to an oxidizing atmosphere in the course of the process, it has often been necessary to perform the re-cleaning of the copper surface in the course of the process.

Ideas to solve this problem have been proposed. For example, Patent Document 1 relates to a method of manufacturing a semiconductor integrated circuit device having a buried interconnect in which copper is a main conductive layer, and in an ammonia plasma treatment step, which is one of the processes adopted in this method, a thin nitrided layer is formed on a surface of copper and it is suggested that the formation of an oxide layer is capable of being suppressed because of this nitrided layer. Furthermore, several techniques using plasma have been proposed. However, the case of the techniques using plasma poses the problem that it is impossible to deny the possibility that what is called plasma damage occurs.

On the other hand, in recent years, metal nanoparticles have been developed. Metal nanoparticles refer to particles of not more than 100 nm, preferably not more than 30 nm in terms of primary average particle diameter, can be prepared by an in-gas evaporation method (a method by which metals and the like are evaporated in an inert gas and nanosize-particles having uniform particle size are manufactured) and can be dispersed in an organic solvent, such as toluene. In order to stabilize dispersibility for a long period, it is effective to add a dispersant, an anti-foaming agent and the like and by adding a thermosetting resin, such as phenol resins and epoxy resins, it is effective to accelerate the coalescence and fusion among nanoparticles by the setting and contraction of the thermosetting resin. Examples of materials include copper, silver, gold and the like. Fine particles of these materials have the great feature that they permit direct writing by an ink jet technique. Metal nanoparticles are contained in an organic solvent, and a desired pattern of metal nanoparticles is written by an ink jet technique which has been put into practical use in a printer.

Although noble metals such as silver and gold are inherently difficult to oxidize, copper has the property of being easy to oxidize compared to silver and gold. After the writing of an interconnect pattern, it is necessary to perform a heat treatment (150 to 300° C. or so) for evaporating the organic solvent and furthermore for causing copper particles to adhere to each other. However, the copper surface is oxidized also during this heat treatment. In metal nanoparticles, the proportion of atoms in the surface portion is large and, therefore, metal nanoparticles have the problem that interconnect resistance increases due to the formation of surface copper oxides.

Because an organic solvent cannot be thoroughly removed only with heat treatment, the resistivity of a copper interconnect cannot be reduced and under the present circumstances copper cannot be used as interconnects. With respect to a reduction of resistance after writing, in particular, in the case of copper, adequate solutions have not been found out as yet.

Also, instead of direct writing techniques such as an ink jet technique, in techniques using lithography which involves mixing copper in a resist, various ideas to reduce the resistance of copper have been proposed and, for example, Patent Document 6 is known. In a reduction heat treatment technique used in Patent Document 6, the reduction heat treatment is performed in an inert gas (or in a vacuum) containing not more than 4% of molecular ($H_2$) hydrogen at temperatures of 200 to 450° C. Thus, in this technique, a direct writing technique is not adopted although the fine particles of copper are used, and the reduction temperature is as high as 200 to 450° C. At such high temperatures, it is difficult to use this technique in the semiconductor mounting region.

[Patent Document 1]: Japanese Patent Laid-Open No. 2002-110679
[Patent Document 2]: Japanese Patent Laid-Open No. 2003-347241
[Patent Document 3]: Japanese Patent Laid-Open No. 2001-176878
[Patent Document 4]: Japanese Patent Laid-Open No. 2004-127503
[Patent Document 5]: Japanese Patent Laid-Open No. 11-26465
[Patent Document 6]: Japanese Patent Laid-Open No. 2002-75999

DISCLOSURE OF THE INVENTION

Problem to be Solved by the Invention

To solve the above-described problems, the gist of the present invention resides in providing a method of processing a copper surface which involves forming a protective film capable of being readily removed on a copper surface without using plasma and removing the protective film from the copper surface on which the protective film is formed for a treatment in the next step.

Also, by solving the problem that interconnect resistance increases due to the formation of surface copper oxides in forming a patterned interconnect by a direct writing technique using copper metal nanoparticles, the present invention has as its object the achievement of a reduction of resistance after writing so that the patterned interconnect can be mounted on a semiconductor.

Means for Solving the Problem

A method of processing a copper surface of the present invention is characterized in that a gas of a compound containing hydrogen and nitrogen is brought into contact with a heated catalytic body, whereby a contaminant on a copper surface is reduced and removed by causing a chemical species generated by a catalytic decomposition reaction to react with the copper surface and a copper nitride film is thereby formed on the copper surface. This formed copper nitride film can be removed by heating. By using this method of processing a copper surface of the present invention, the surfaces of copper metal nanoparticles can also be treated in the same way.

A method of forming a patterned copper interconnect of the present invention is characterized by comprising a step of forming a patterned interconnect by a direct writing technique using copper metal nanoparticles on a substrate, and a step of subjecting the interconnect to a treatment of reduction of an oxide film on a metal surface and/or removal of an organic substance by atomic hydrogen. Also, in the present invention, it is possible to form a patterned interconnect by using copper metal nanoparticles in which a copper nitride film is formed beforehand on particle surfaces.

A semiconductor device of the present invention is characterized in that there is provided a through-semiconductor-substrate electrode which connects a top surface side and a rear surface side by passing through a semiconductor substrate having an LSI-formed surface, and in that for one or both of a multilayer interconnect portion formed on the LSI-formed surface on the top surface side of the semiconductor substrate and a rear surface interconnect formed on the rear surface side of the semiconductor substrate, a patterned interconnect is formed by a direct writing technique using copper metal nanoparticles, the interconnect being subjected to a treatment of reduction of an oxide film on a metal surface and/or removal of an organic substance by atomic hydrogen.

Effect of the Invention

According to the present invention, by causing a chemical species generated by a catalytic decomposition reaction of a compound containing hydrogen and nitrogen to react with a copper surface, a contaminant on the copper surface can be reduced and removed and a copper nitride protective film capable of readily removed can be formed on the copper surface. After that, by heating the copper surface on which the protective film is formed, the protective film is readily thermally decomposed and removed and a clean copper surface can be obtained and, therefore, a copper surface treatment method not requiring re-cleaning is provided. Also, according to the present invention, it is possible to form a protective film on the copper surface without changing the properties of a material other than copper on a substrate, for example, the permittivity of a dielectric material.

Also, according to the present invention, reduction is performed under a reduced pressure by use of atomic hydrogen (H) decomposed by a metal catalyst of the hot-wire method. Therefore, the reduction activity of atomic hydrogen is much higher than the reduction activity of molecular hydrogen and, for this reason, the reduction is possible at lower reduction temperatures. As a result of this, by applying the present invention to the manufacture of semiconductor devices, it becomes possible to lower resistance after the writing of a patterned interconnect. Furthermore, according to the present invention, in a case where ammonia is used a raw material, decomposition species decomposed by a metal catalyst of the hot-wire method, such as atomic H, NH, $NH_2$ and N, perform reduction or nitriding under a reduced pressure and a nitrided copper surface performs the reaction of decomposition at temperatures of not less than 120° C. Therefore, it is possible to freely perform reduction or nitriding by selecting conditions. Also as a result of this, by applying the present invention to the manufacture of semiconductor devices, it becomes possible to lower resistance after the writing of a patterned interconnect.

BEST MODE FOR CARRYING OUT THE INVENTION

The present invention is characterized in that a gas of a compound containing hydrogen and nitrogen is brought into contact with a heated catalytic body, whereby a contaminant on a copper surface is reduced and removed by causing a chemical species generated by a catalytic decomposition reaction to react with the copper surface and a copper nitride film is formed on the copper surface, and in that the formed copper nitride film is removed by heating. In the present invention, "copper" means copper or substances which contain copper in part thereof. So long as a substance contains copper, the same effect as with pure copper is obtained. Also, by the present invention the surfaces of copper metal nanoparticles can be similarly treated. That is, by causing a chemical species generated by a catalytic decomposition reaction to react with the surfaces of copper metal nanoparticles, a copper nitride film can be formed as a protective film on the surfaces of the copper metal nanoparticles.

In the present invention, as a compound containing hydrogen and nitrogen, it is also possible to use, for example, hydrazine and a mixture of ammonia and an inert gas, in addition to ammonia gas. Particularly, ammonia is advantageously used.

Preferable catalytic bodies of the present invention are any one of materials selected from the group consisting of tungsten, rhenium, tantalum, molybdenum, vanadium, platinum, thorium, zirconium, yttrium, hafnium, palladium, iridium, ruthenium, iron, nickel, chromium, aluminum, silicon and carbon, or any one of oxides of simple substances of these materials, nitrides of simple substances of these materials, carbides of simple substances of these materials (except carbon). Or alternatively, preferable catalytic bodies may be any one of oxides of mixed crystals or compounds consisting of two or more kinds selected from these materials, nitrides of mixed crystals or compounds consisting of two or more kinds selected from these materials, or carbides of mixed crystals or compounds consisting of two or more kinds selected from these materials (except carbon).

For the temperature of copper (the substrate which will be described later) during a reaction, temperatures of not more than 200° C. are desirable in a case where a protective film is deposited on the copper surface and temperatures of not less than 300° C. are desirable in a case where a protective film is removed from the copper surface. For the flow rate of a gas of a compound containing hydrogen and nitrogen, such as ammonia gas, it is possible to select an arbitrary amount which does not cool copper or a catalytic body. For the temperature of a catalytic body, for example, in the case of a tungsten catalytic body, the temperature range of 1000° C. to 2200° C. is appropriate.

Figure 1:
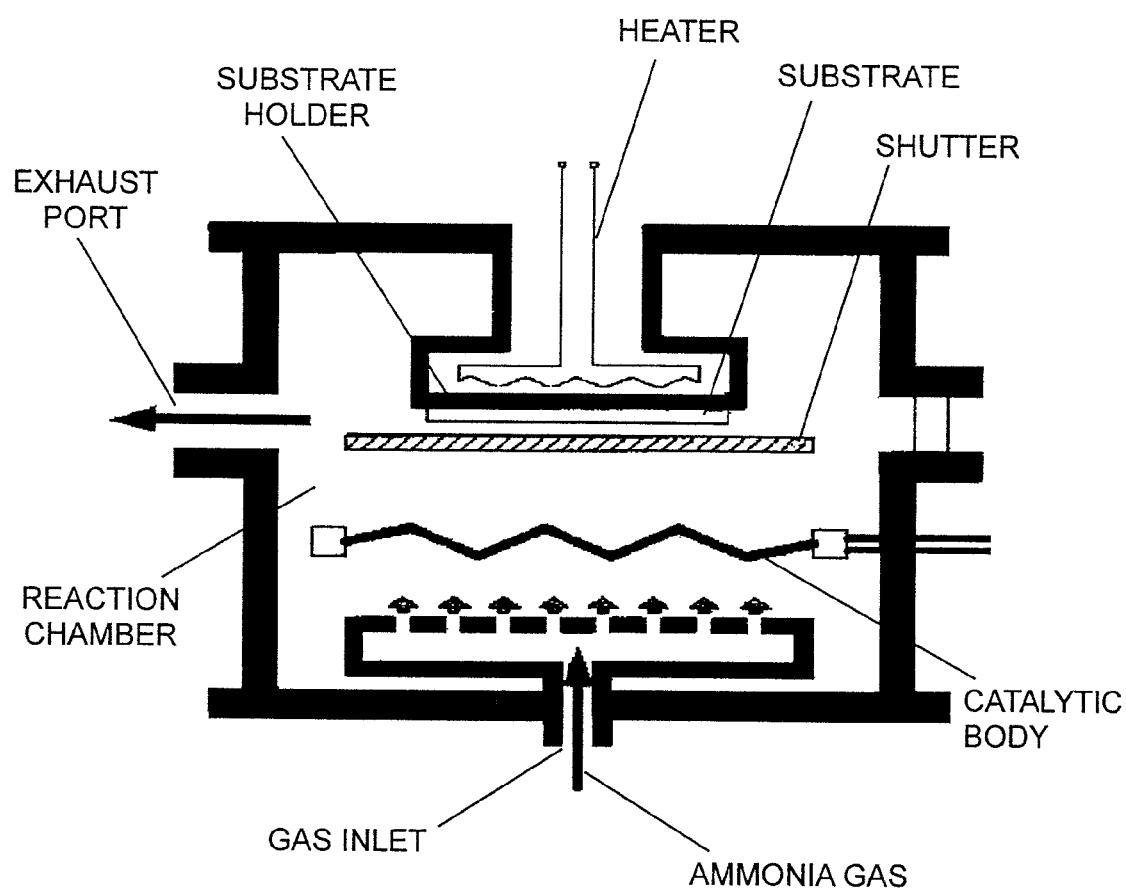
FIG. 1 is a schematic diagram of the section of a reactor (an example) to carry out a method of the present invention.

FIG. 1 is a schematic diagram of the section of a protective film forming device used in the present invention. As a reactor used in a method of forming a copper surface protective film of the present invention, for example, the treatment device described in Patent Document 2 can be used. From a gas inlet on the bottom surface of a reaction chamber, for example, ammonia gas is fed into the reaction chamber. A heater is provided outside the reaction chamber immediately above the reaction chamber, a substrate holder is present within the reaction chamber immediately under the heater, and a substrate is placed on the substrate holder, with a surface on which a protective film is to be deposited facing downward. At a point midway between the substrate and the gas inlet, a catalytic body made of, for example, a tungsten wire is provided and a gas which has flown in is decomposed by heating the catalytic body to high temperatures. Decomposition products include active species of hydrogen, nitrogen, NH, NH$_2$ and the like in a nascent state, and these reduce and remove a contaminant on the copper surface and react with a clean copper surface under the formation of copper nitrides. Because copper nitrides decompose at temperatures of not less than 120° C., only reduction and removal proceed at temperatures of not less than 120° C. A shutter is provided to prevent the deposition on the substrate until the above-described decomposition reaction becomes stable. An exhaust port is provided to discharge remaining reaction gases.

In the present invention, contamination due to an organic solvent and oxides of a copper interconnect formed by a direct writing technique, such as the ink jet method and the screen printing method, are removed at low temperatures of not less than room temperature but not more than 200° C. This removal will be described below.

(1) Forming a Copper Interconnect by the Ink Jet Method (or the Screen Printing Method).

Copper metal nanoparticles are contained in an organic solvent, and a desired pattern of the copper metal nanoparticles is written by the ink jet method which has been put to practical use in a printer. After that, a heat treatment for evaporating the organic solvent is performed. Or alternatively, in the case of the screen printing method, a nanopaste which is prepared by causing copper metal nanoparticles to be contained in an organic solvent is applied by the screen printing method to a substrate and then baked by heating, whereby it is possible to form a circuit interconnect.

In the present invention, contamination due to an organic solvent and oxides are removed from a copper interconnect formed by such direct writing techniques. In a case where the heat treatment for evaporating the organic solvent is performed, copper oxide is formed by the copper surface oxidation. However, this copper oxide can also be removed by an atomic hydrogen treatment. Or alternatively, the present invention can also be applied to a case where the heat treatment for evaporating the organic solvent is not performed. Although when this heat treatment is not performed, the copper metal nanoparticles still contain the organic solvent, it becomes possible to remove the organic solvent by an atomic hydrogen treatment which is performed later.

(2) Next, the copper oxide and organic solvent pollutant are removed by atomic hydrogen or a decomposition species of ammonia in a copper interconnect cleaning device. When atomic hydrogen is used at this time, the copper interconnect is reduced and cleaned. When a decomposition species of ammonia is used, the copper interconnect is nitrided if the temperature of the substrate is not more than 120° C. and reduced and cleaned by the decomposition of copper nitride if the temperature of the substrate is not less than 120° C. At this time, it is possible to lower resistance by reducing interface resistance due to the baking of the particles used in the interconnect simultaneously with the reduction and cleaning of the copper surface. Although it is also possible to separately perform a sintering treatment after the decomposition treatment of the surface protective film of copper nitride, it is preferred that the sintering treatment be performed at about 200° C. in a reducing gas atmosphere of atomic hydrogen and the like. In a case where a thermosetting resin is contained in the nanopaste, it is desirable that the sintering treatment be performed at temperatures from 200° C. to the temperature range of the thermosetting resin.

In the present invention, it is possible to use copper metal nanoparticles which are subjected to a pretreatment for forming a copper nitride film as a protective film before the formation of a copper interconnect by the ink jet method (or the screen printing method). By using copper metal nanoparticles which are subjected to this pretreatment, a patterned interconnect is formed by a direct writing technique. For example, in a case where the ink jet method is used, a desired pattern is written by causing the copper metal nanoparticles which are subjected to the pretreatment are caused to be contained in an organic solvent. The heat treatment for evaporating the organic solvent can be performed in this stage where interconnect is patterned, or by performing the next stage of a treatment for nitrogen removal, the organic solvent is simultaneously removed. In the treatment for nitrogen removal, by heating the formed patterned interconnect to temperatures of not less than 120° C., the surface protective film of copper nitride is decomposed. At this time, it is possible to lower resistance by reducing interface resistance due to the baking of the particles used in the interconnect simultaneously with the decomposition of the nitride film. Although it is also possible to separately perform a sintering treatment after the decomposition treatment of the surface protective film of copper nitride, it is preferred that the sintering treatment be performed at about 200° C. in a reducing gas atmosphere of atomic hydrogen and the like.

Figure 2:
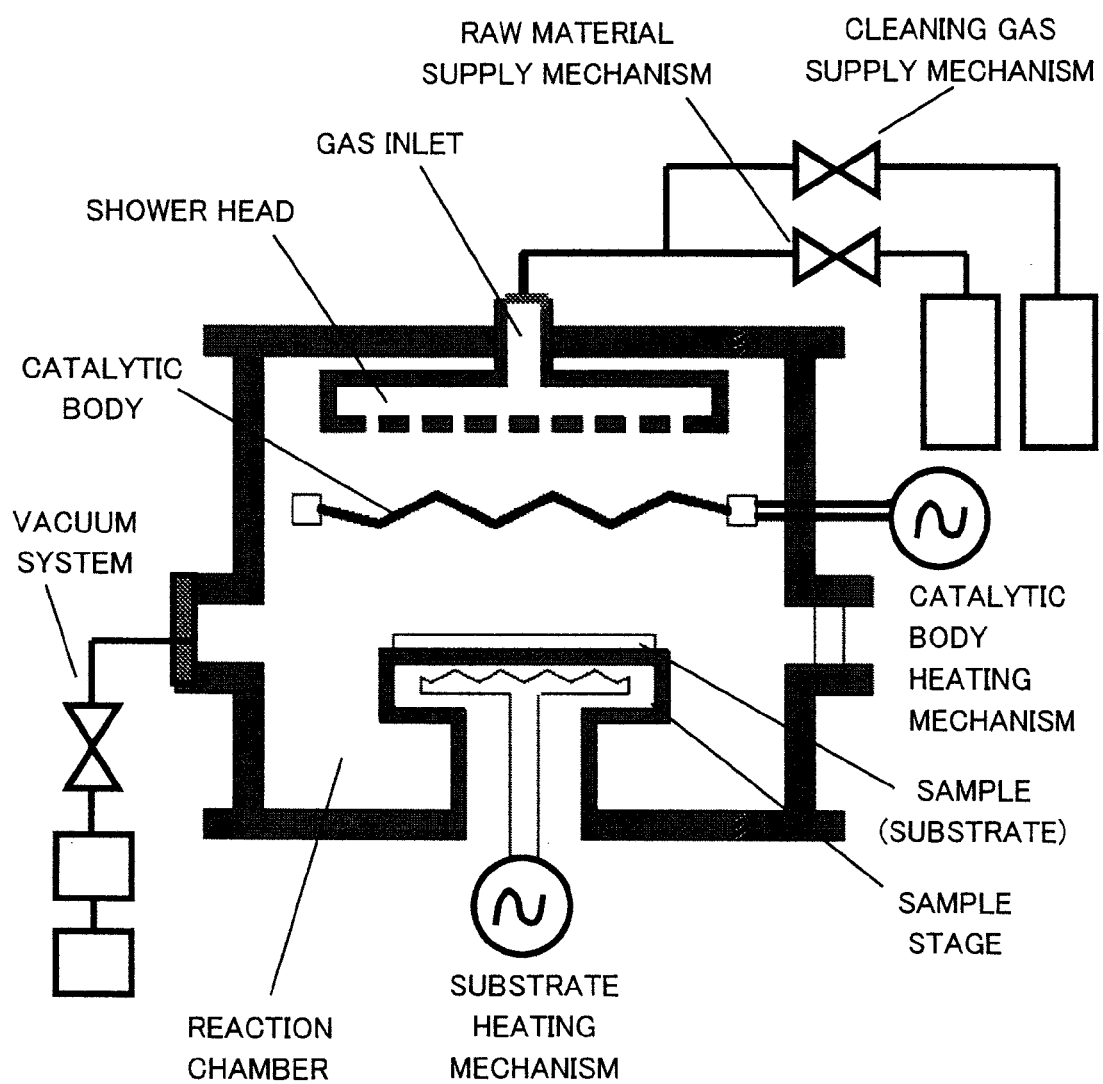
FIG. 2 is a schematic diagram of the section which shows another example of a reactor used as a copper interconnect cleaner, which is different from FIG. 1.

FIG. 2 is a schematic diagram of the section which shows another example of a reactor that can be used as a copper interconnect cleaner, which is different from FIG. 1. From a gas inlet on the top surface of a reaction chamber, hydrogen and raw materials containing hydrogen, such as ammonia and hydrazine, are fed as raw materials for atomic hydrogen or a decomposition species of ammonia through a cleaning gas supply mechanism.

A substrate heating mechanism, such as a heater, is provided outside a reaction chamber immediately under the reaction chamber, and upon a sample stage within the reaction chamber immediately above this heating mechanism there is placed a sample (a substrate), with a surface thereof on which a protective film is to be deposited facing upward. At a point midway between a shower head which diffuses a gas from the gas inlet and the sample, a catalytic body made of, for example, a tungsten wire is provided and a gas which has flown in is decomposed by heating the catalytic body to high temperatures through a catalytic body heating mechanism. As a result of this, atomic hydrogen or a decomposition species of ammonia is generated by a catalytic decomposition reaction by the heated catalyst. Oxides of the copper interconnect are removed by the reduction of the atomic hydrogen and an organic pollutant can be removed by the formation of hydrocarbon due to a reaction of the atomic hydrogen with carbon.

It is possible to use compounds containing also nitrogen, for example, ammonia and hydrazine as the above-described compounds containing hydrogen which are raw materials for atomic hydrogen or a decomposition species of ammonia. In this case, by bringing a gas of these compounds into contact with a heated catalytic body, atomic nitrogen is generated simultaneously with atomic hydrogen and it is possible to perform the nitriding treatment of the metal surface by atomic nitrogen along with the reduction of the metal surface oxide film and/or the removal of the organic substance by atomic hydrogen.

Materials as described above with reference to FIG. 1 can be used as materials for the catalytic body. For the temperature of the catalytic body, the temperature range of 1000° C. to 2200° C. is appropriate in the case of a catalytic body of tungsten, for example.

Incidentally, as required, the raw material supply mechanism in FIG. 2 is to serve also to supply hexamethyldisilazane, silane and the like which are used to deposit an SiN-based film, for example. The vacuum system is to discharge residual reaction gases.

A silicon LSI wafer, in which a patterned interconnect using copper metal nanoparticles is formed by use of this copper interconnect cleaner, is placed on the sample stage as a sample (a substrate). And in order to remove the contamination from the silicon LSI wafer, in which a patterned interconnect using copper metal nanoparticles is formed, hydrogen gas is caused to flow at a flow rate of 30 sccm for 10 minutes, and the removal of the contamination is performed by this treatment.

Embodiment 1

By use of the reactor shown in FIG. 1, a silicon LSI wafer in which copper interconnects had been formed by the damascene process was placed as a substrate on the substrate holder. The temperature of the substrate holder was heated to 60° C., the catalytic body of a tungsten wire was heated to 1600° C., and the pressure in the reaction chamber was set at $2.7 \times 10^{-5}$ Pa. First, contamination was removed from the silicon LSI wafer in which copper interconnects had been formed by the damascene process and in order to continuously form a protective film of a copper surface, ammonia gas was caused to flow at a flow rate of 50 sccm for 20 minutes, whereby the ammonia gas treatment of the silicon substrate was performed. By this treatment, the removal of the contamination and the formation of a protective film on the copper surface from which the contamination had been removed were performed in order.

Figure 3:
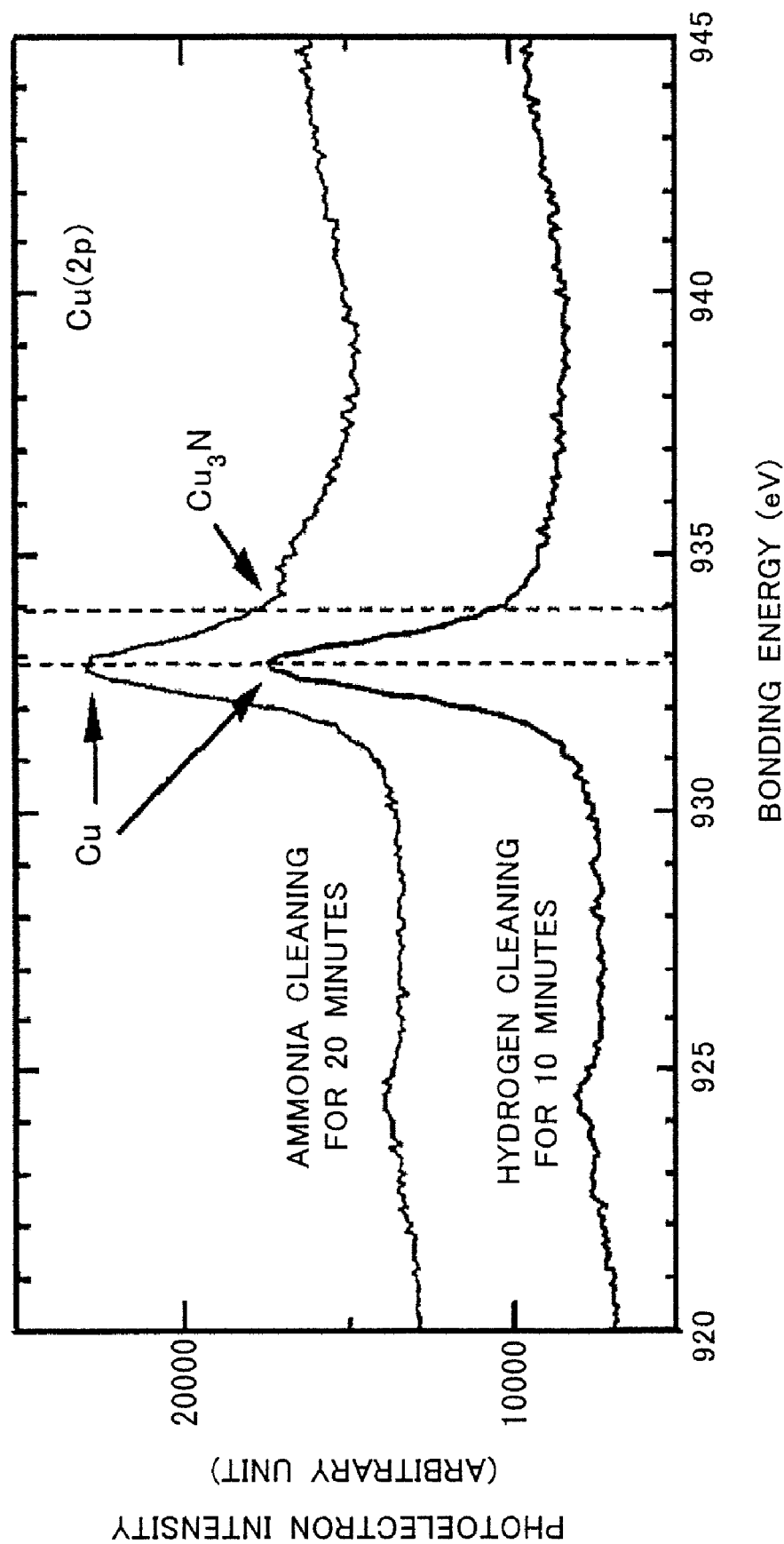
FIG. 3 is an X-ray photoelectron spectrum diagram which shows that $Cu_3N$ is produced on a copper surface by copper surface treatment by ammonia.

FIG. 3 shows spectra obtained by the X-ray photoelectron spectroscopy (XPS) when the ammonia treatment time was 20 minutes. The abscissa indicates bonding energy and the ordinate indicates photoelectron intensity. A peak of bonding energy of $Cu_3N$ which is 0.8 V higher than that of copper is observed. From this, it is apparent that $Cu_3N$ was generated by the ammonia treatment.

Figure 4:
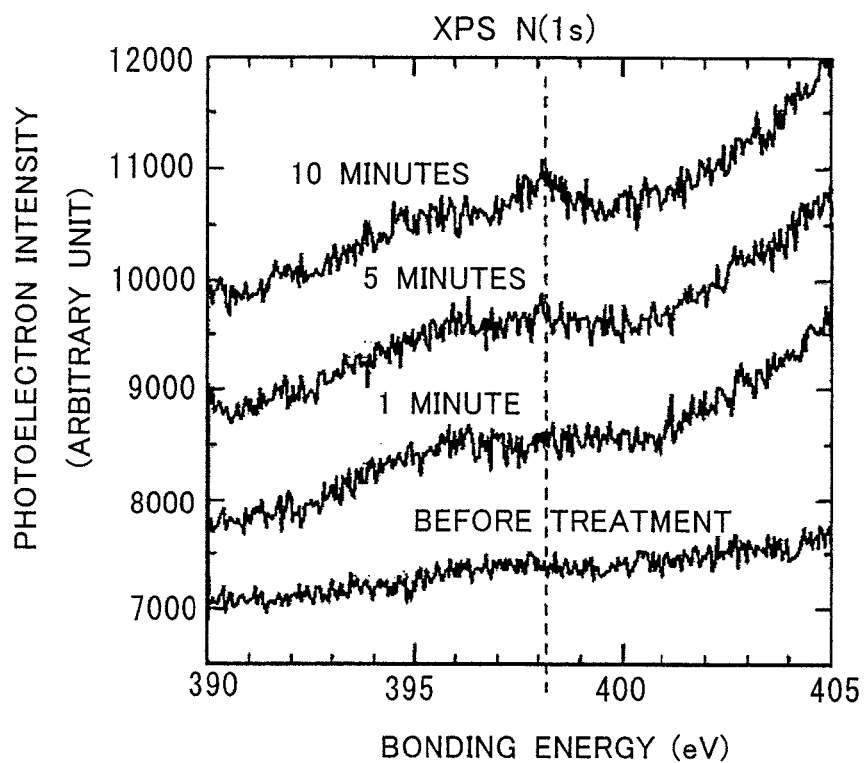
FIG. 4 is a diagram which shows the relationship between the amount of nitride produced on a copper surface and the time for copper surface treatment by ammonia.
Figure 5:
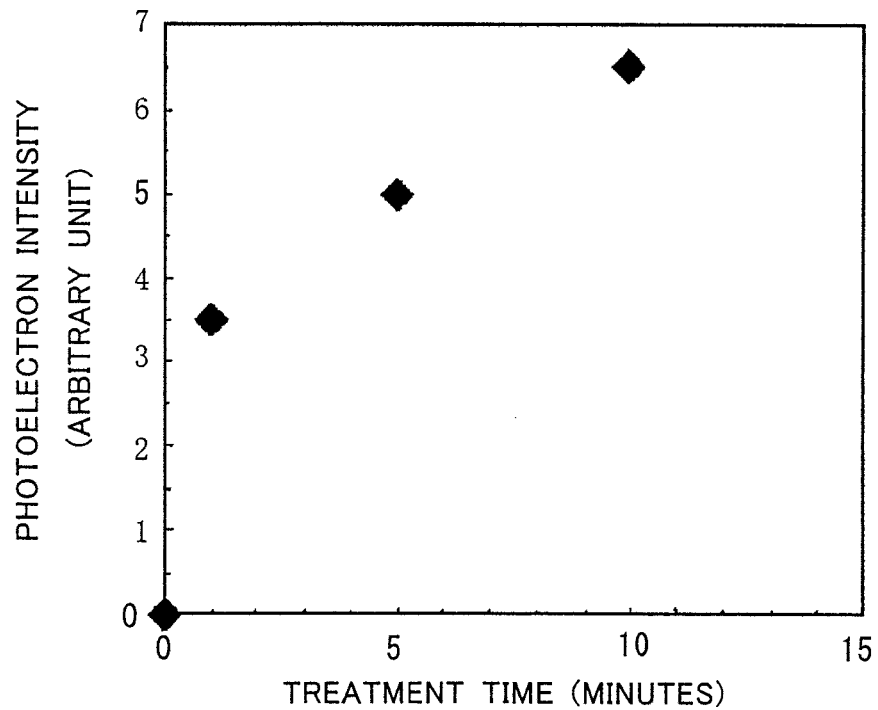
FIG. 5 is a diagram which shows the relationship between the height of peaks of N(1s) in $Cu_3N$ shown in FIG. 4 and the ammonia treatment time.

FIG. 4 shows changes in the spectra of the X-ray photoelectron spectroscopy (XPS) if the ammonia treatment time is varied. In FIG. 4, peaks of N(1s) in $Cu_3N$ appear. FIG. 5 shows the relationship between the height of the peaks and the ammonia treatment time. It is apparent that $Cu_3N$ increases with increasing treatment time.

Next, the above-described silicon LSI substrate subjected to the ammonia treatment was taken out of the reaction chamber and then allowed to stand at room temperature for 30 days. Changes in the copper surface protective film during this period were measured by the X-ray photoelectron spectroscopy (XPS). As a result, the amount of surface oxide was not more than 1/10 of a usual thickness. From this, it is apparent that the protective film of copper is stable at temperatures close to room temperature.

Embodiment 2

The above-described silicon LSI substrate on which a copper protective film had been deposited after being allowed to stand was again put into the above-described reaction chamber and subjected to a heat treatment in a vacuum. From the measurement results of the X-ray photoelectron spectroscopy (XPS), it became apparent that when the treatment is performed at 350° C. for 150 minutes, the copper protective film is completely thermally decomposed and removed.

Embodiment 3

Figure 6:
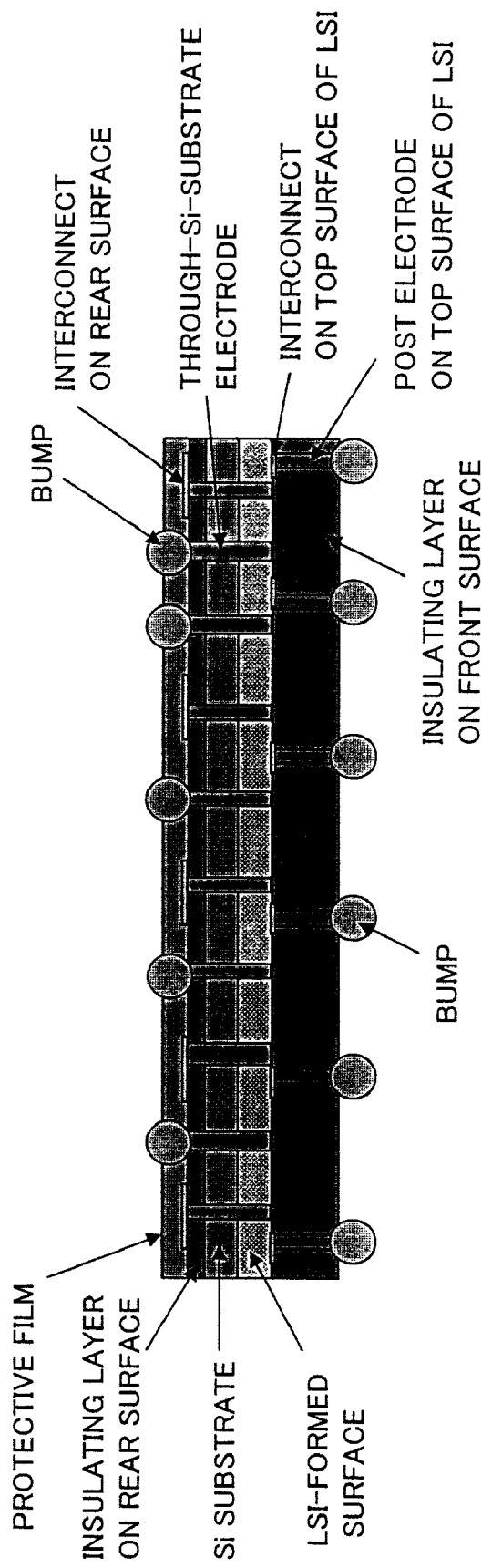
FIG. 6 is a diagram which shows an example in which the technique of the present invention for removing contamination due to an organic solvent and oxides is applied to a semiconductor device.

FIG. 6 is a diagram which shows an example in which the technique of the present invention for removing contamination due to an organic solvent and oxides is applied to a semiconductor device. In the illustrated semiconductor device, an LSI-formed surface is present on the top surface of an Si substrate. A circuit (a circuit element) is formed on the LSI-formed surface. In the figure, the side where this LSI-formed surface is present is called the top surface side, and the reverse side is called the rear surface side. And the semiconductor device is illustrated, with this top surface side facing downward.

The semiconductor substrate (Si substrate) having the LSI-formed surface is provided with a through-Si-substrate electrode which connects the top surface side and the rear surface side. On this top surface side (the bottom side in the figure), a multilayer interconnect portion (a interconnect on the top surface of the LSI) is formed on the LSI-formed surface. Furthermore, for connections to prescribed positions on this interconnect on the top surface of the LSI, multiple columnar Cu post electrodes (post electrodes on the top surface of the LSI) are formed there. This post electrode is covered with a surface insulating layer by a plastic mold, for example, and at the leading end of the post electrode there is provided a bump for external connection.

On the other hand, on the rear side of the Si substrate present on the upper side of the Figure, the rear side of the Si substrate is polished in such a manner that the leading end of the through electrode is exposed. Furthermore, only Si is selectively etched and the leading end of the through electrode is caused to protrude from the rear surface of the semiconductor substrate. A rear surface insulating film is applied to this rear surface until the through electrode becomes hidden. A rear surface interconnect is formed on this rear surface insulating film. A protective film is applied to this interconnect. Furthermore, an opening is provided in the protective film on the bump-formed portion on the interconnect, and a bump is formed in the opening.

As a result of this, a bump electrode for external connection is provided on each of both surfaces on the front surface side and the rear surface side, and there is formed a stacked semiconductor device capable of being used by being stacked on another semiconductor device and the like. The present invention is applied to a rear surface interconnect of such a semiconductor device or a interconnect on the top surface of an LSI, thereby making it possible to remove contamination due to an organic solvent and oxides.

Embodiment 4

Figure 7:
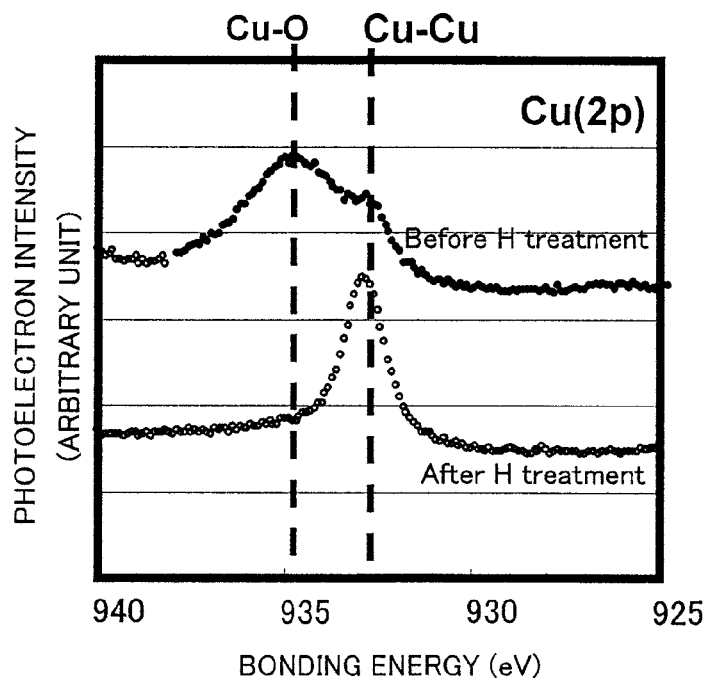
FIG. 7 is a diagram of photoelectron spectra of Cu(2p) of copper deposited on a silicon substrate by the sputtering method, which were obtained before and after the removal by atomic hydrogen.
Figure 8:
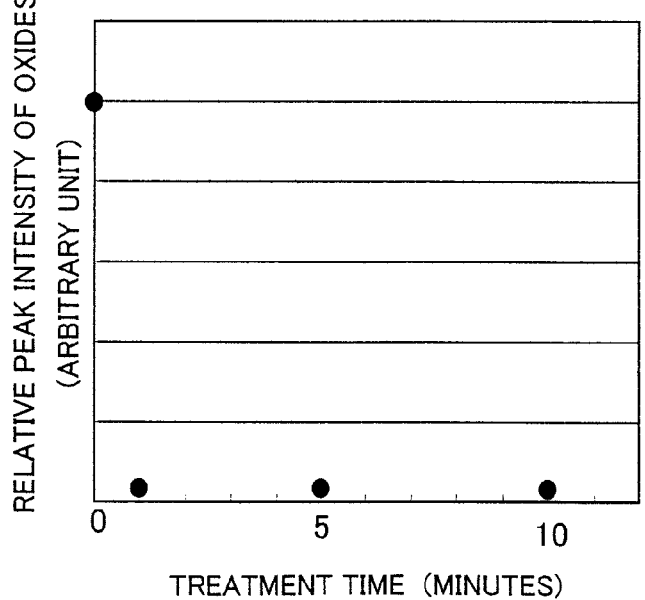
FIG. 8 is a diagram which shows the relationship between the atomic hydrogen treatment time and the peak intensity of Cu—O of FIG. 7.

FIGS. 7 and 8 are diagrams which show the copper surface cleaning by atomic hydrogen (oxides). FIG. 7 shows a diagram of photoelectron spectra of Cu(2p) of copper deposited on a silicon substrate by the sputtering method, which were obtained before and after the removal by atomic hydrogen. The abscissa indicates bonding energy (eV) and the ordinate indicates photoelectron intensity (arbitrary unit), both in relative values. For the atomic hydrogen treatment conditions, the temperature of a tungsten catalytic body was 1700° C., the substrate temperature was 50° C., and the treatment time was 20 minutes. Although a peak by Cu—O appears on the high bonding energy side before the treatment, this peak disappears completely by the atomic hydrogen treatment. FIG. 8 shows the relationship between the atomic hydrogen treatment time and the peak intensity of Cu—O of FIG. 7. It is apparent that the removal of Cu—O is made possible by performing the treatment for one minute. A similar result is obtained also in a case where ammonia is used.

Figure 9:
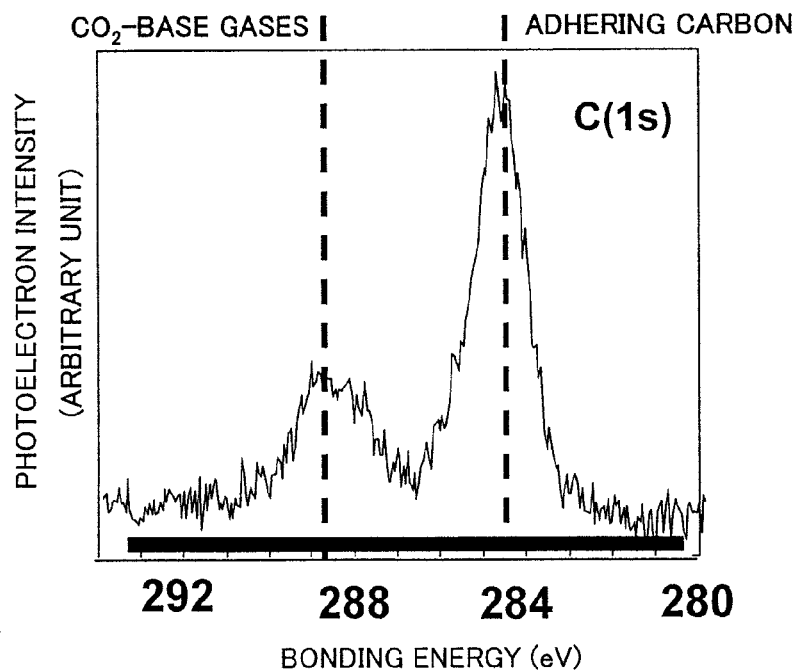
FIG. 9 is a diagram which shows the spectrum of C(1s) on a copper surface by the photoelectron spectroscopy.
Figure 10:
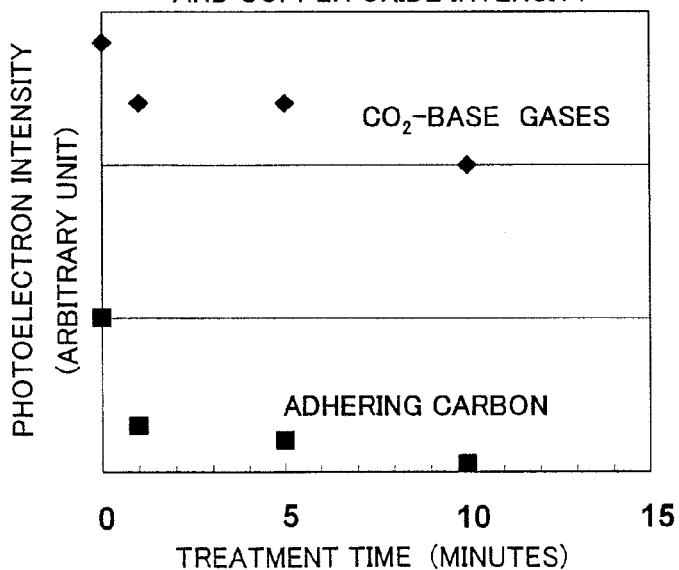
FIG. 10 is a diagram which shows the relationship between the atomic hydrogen treatment time and the peak intensity from each component of FIG. 9.

FIGS. 9 and 10 are diagrams which show the copper surface cleaning by atomic hydrogen (carbon-based gases). FIG. 9 is a diagram which shows the spectrum of C(1s) on a copper surface by the photoelectron spectroscopy. On the high bonding energy side, the photoelectron intensity is due to gas components coming from the $CO_2$ system. And on the low bonding energy side, the photoelectron intensity is due to adhering carbon caused by contamination and the like. FIG. 10 is a diagram which shows the relationship between the atomic hydrogen treatment time and the peak intensity from each component of FIG. 9. The removal of adhering carbon by atomic hydrogen is possible. It seems that adhering carbon has not been completely removed. However, because a sample is transferred through the air between an atomic hydrogen treatment device and a photoelectron spectroscopic device, carbon adheres to the sample during the transfer. This is the reason for the incomplete removal. On the other hand, it is observed that the intensity of $CO_2$-based gases also decreases. As a result of this, it might be thought that this treatment is effective in preventing the adsorption of $CO_2$-based gases and the like on the surface.

The above-described results were obtained in the case where atomic hydrogen was used. However, similar results were obtained also in a case where ammonia was used. If ammonia is used when the substrate temperature is not less than the decomposition temperature of $Cu_3N$ (about 120° C. or so), the surface becomes Cu and this is the same as in the case where hydrogen is used. When the substrate temperature is not more than the decomposition temperature, the surface is nitrided and becomes $Cu_3N$. When this $Cu_3N$ is heated to the decomposition temperature, $Cu_3N$ is decomposed and the surface becomes Cu. This is the same as in the case where hydrogen is used.

Embodiment 5

By use of a copper nanopaste having a primary average particle system of 5 nm obtained in the in-gas evaporation method (NPC-J made by Harima Chemicals, Inc.), an interconnect pattern 0.1 mm in width and 100 mm in length was formed on a polyimide substrate by an ink jet technique. This sample was loaded on the substrate holder of the device of FIG. 1. The substrate holder temperature was raised from 200° C. to 250° C., the temperature of the tungsten catalytic body was heated to 1700° C., and the pressure in the reaction chamber was set at $2.7 \times 10^{-7}$ Pa. Hydrogen gas was caused to flow at a flow rate of 50 sccm for 10 minutes and decomposed into atomic hydrogen on the tungsten catalyst, and the copper interconnect pattern was treated. Before the treatment, the color of the copper nanopaste interconnect was black. However, the color changed to the color of metal copper after the atomic hydrogen treatment. When a conducting test was performed by use of a tester for resistance measurement, a good electrical conductivity of $3 \times 10^{-6}$ Ω·cm was shown.

Embodiment 6

A sample in which an interconnect pattern had been formed on a polyimide substrate in the same manner as in Embodiment 5 was loaded on the substrate holder of the device of FIG. 1. The substrate holder was heated to 50° C., the temperature of a tungsten catalytic body was raised to 1700° C., and the pressure in the reaction chamber was set at $2.7 \times 10^{-5}$ Pa. Ammonia gas was caused to flow at a flow rate of 50 sccm for 20 minutes and decomposed on the tungsten catalyst, and the copper interconnect pattern was treated. After that, the substrate holder temperature was raised from 200° C. to 250° C. and the treatment was performed by continuing the reaction for 10 minutes. Before the ammonia treatment, the color of the copper nanopaste interconnect was black. However, the color changed to the color of metal copper after the ammonia treatment. When a conducting test was performed by use of a tester for resistance measurement, a good electrical conductivity of $3 \times 10^{-6}$ Ω·cm was shown.

Embodiment 7

In place of the copper interconnected on a silicon substrate, copper nanoparticles having a primary average particle system of 5 nm obtained by the in-gas evaporation method were put on a plate made of platinum and the nitriding treatment was performed in the same manner as in Embodiment 1, whereby copper nanoparticles whose surfaces are nitrided were prepared. A hundred parts by weight of these copper nanoparticles were mixed with 50 parts by weight of toluene and 10 parts by weight of dodecyl amine, dispersed by ultrasonic waves, and further filtered by use of a polytertaethylene filter having a mesh size of 0.5 μm, whereby a copper nanoparticle paste whose surfaces are nitrided was obtained. By using this paste, an interconnect pattern 0.1 mm in width and 100 mm in length was written on a polyimide substrate by the an ink jet technique. After that, temperature raising was performed in a vacuum from 200° C. to 250° C., and for 20 minutes, the thermal decomposition of the nitrided copper formed on the surface of the copper nanoparticles and the densification treatment of the thermally decomposed copper nanoparticles were performed. The copper interconnect after the treatment had the color of metal copper. When a conducting test was performed by use of a tester for resistance measurement, a good electrical conductivity of $3\times10^{-6}$ Ω·cm was shown.

COMPARATIVE EXAMPLE 1

A sample in which an interconnect pattern had been formed on a polyimide substrate in the same manner as in Embodiment 5 was subjected to a heat treatment at 250° C. for 30 minutes in a reducing nitrogen gas atmosphere containing 5% hydrogen gas, and the densification of copper nanoparticles was performed. The interconnect after the treatment had a dull color of metal copper. When a conducting test of this copper interconnect was performed by use of a tester for resistance measurement, the electrical conductivity was $7\times10^{-6}$ Ω·cm and a good electrical conductivity was not shown.

INDUSTRIAL APPLICABILITY

By carrying out the present invention, it is possible to reduce and remove a pollutant on a copper surface and to form on the copper surface a protective film of nitrided copper capable of readily removed. By heating thereafter the copper surface on which the protective film is formed, the protective film can be readily removed. Moreover, according to the present invention, it is possible to form a protective film on the copper surface without changing the properties of a material other than copper on a substrate, for example, the permittivity of a dielectric material. Therefore, the present invention has the potential of becoming a very useful technique, for example, in the manufacturing process of an interconnect material for a silicon integrated circuit.

The invention claimed is:

1. A method of processing a copper surface, the method comprising steps of:
    bringing a gas of a compound containing hydrogen and nitrogen into contact with a heated catalytic body;
    reducing and removing a contaminant on a copper surface by causing a chemical species generated by a catalytic decomposition reaction to react with the copper surface and thereby forming a copper nitride film as a protective film on the copper surface; and
    removing the formed copper nitride film by heating.

2. The method of processing a copper surface according to claim 1, wherein the compound containing hydrogen and nitrogen is ammonia.

3. The method of processing a copper surface according to claim 1, wherein the catalytic body is anyone of materials selected from the group consisting of tungsten, tantalum, molybdenum, vanadium, rhenium, platinum, thorium, zirconium, yttrium, hafnium, palladium, iridium, ruthenium, iron, nickel, chromium, aluminum, silicon and carbon, or anyone of oxides of simple substances of these materials, nitrides of simple substances of these materials, carbides of simple substances of these materials, or anyone of oxides of mixed crystals or compounds consisting of two or more kinds selected from these materials, nitrides of mixed crystals or compounds consisting of two or more kinds selected from these materials, or carbides of mixed crystals or compounds consisting of two or more kinds selected from these materials.

4. A method of forming a copper pattern wiring, the method comprising steps of:
    forming a patterned interconnect by a direct writing technique using copper metal nanoparticles on a substrate;
    treating the interconnect by reducing an oxide film on a metal surface and/or removing an organic substance by atomic hydrogen; and
    densifying the copper metal nanoparticles by heating simultaneously with the treatment step and/or thereafter.

5. The method of forming a copper pattern wiring according to claim 4, wherein the atomic hydrogen is atomic hydrogen by a catalytic decomposition reaction which occurs by bringing a gas of a hydrogen-containing compound into contact with a heated catalytic body.

6. The method of forming a copper pattern wiring according to claim 4, wherein the method of forming a patterned interconnect is an ink jet technique.

7. The method of forming a copper pattern wiring according to claim 5, wherein the hydrogen-containing compound is a compound which contains also nitrogen, and in that by bringing a gas of the compound into contact with a heated catalytic body, a decomposition species which contains nitrogen along with atomic hydrogen is generated and a nitriding treatment of a metal surface by the nitrogen-containing decomposition species is performed along with the reduction of an oxide film on the metal surface and/or the removal of an organic substance by the atomic hydrogen.

8. A method of forming a copper pattern wiring, the method comprising steps of:
    forming a patterned interconnect by a direct writing technique using copper metal nanoparticles on a substrate;
    bringing a gas of a compound containing hydrogen and nitrogen into contact with a heated catalytic body and thereby nitriding the interconnect by a chemical species generated by a catalytic decomposition reaction;
    thermally decomposing the nitrided metal copper interconnect; and
    densifying the copper metal nanoparticles by heating simultaneously with the thermal decomposition step and/or thereafter.

9. The method of forming a copper pattern wiring according to claim 4, wherein there is provided a through-semiconductor-substrate electrode which connects a top surface side and a rear surface side by passing through a semiconductor substrate having an LSI-formed surface, and in that the method is applied to one or both of a multilayer interconnect portion formed on the LSI-formed surface on the top surface side of the semiconductor substrate and a rear surface interconnect formed on the rear surface side of the semiconductor substrate.

10. A method of forming a copper pattern wiring, the method comprising steps of:
    forming a patterned interconnect by a direct writing technique using copper metal nanoparticles, in which a copper nitride film is formed as a protective film, on the surfaces of the copper metal nanoparticles by bringing a gas of a compound containing hydrogen and nitrogen into contact with a heated catalytic body and thereby causing a chemical species generated by a catalytic decomposition reaction to react with surfaces of the copper metal nanoparticles;
    decomposing the surface protective film of copper nitride to remove nitrogen by heating the formed patterned interconnect; and
    densifying the copper metal nanoparticles by heating simultaneously with the nitrogen removing step and/or thereafter.

* * * * *